(12) United States Patent
Zhou

(10) Patent No.: US 11,315,629 B2
(45) Date of Patent: Apr. 26, 2022

(54) DUAL-PORT SRAM CELL AND LAYOUT STRUCTURE THEREOF

(71) Applicant: SHANGHAI HUALI INTEGRATED CIRCUIT CORPORATION, Shanghai (CN)

(72) Inventor: Xiaojun Zhou, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 11 days.

(21) Appl. No.: 17/098,186

(22) Filed: Nov. 13, 2020

(65) Prior Publication Data

US 2022/0093170 A1    Mar. 24, 2022

(30) Foreign Application Priority Data

Sep. 21, 2020 (CN) .......................... 202010992678.8

(51) Int. Cl.
| | | |
|---|---|---|
| *G06F 30/39* | (2020.01) | |
| *H01L 27/11* | (2006.01) | |
| *H01L 21/8244* | (2006.01) | |
| *H01L 23/528* | (2006.01) | |
| *H01L 21/8238* | (2006.01) | |
| *G11C 8/16* | (2006.01) | |
| *G11C 8/00* | (2006.01) | |
| *G11C 11/00* | (2006.01) | |
| *G11C 7/18* | (2006.01) | |
| *G11C 7/00* | (2006.01) | |
| *G11C 11/418* | (2006.01) | |
| *G11C 11/419* | (2006.01) | |
| *G11C 11/412* | (2006.01) | |

(Continued)

(52) U.S. Cl.
CPC .......... *G11C 11/418* (2013.01); *G11C 11/419* (2013.01); *G11C 7/18* (2013.01); *G11C 8/16* (2013.01); *G11C 11/412* (2013.01); *H01L 27/0207* (2013.01); *H01L 27/108* (2013.01); *H01L 27/1104* (2013.01)

(58) Field of Classification Search
CPC ... G11C 11/418; G11C 11/419; G11C 11/414; G11C 5/06; G11C 5/025; H01L 27/0207; H01L 27/108; G06F 30/39
USPC ........................................................ 365/154
See application file for complete search history.

(56) References Cited

U.S. PATENT DOCUMENTS

| | | | | |
|---|---|---|---|---|
| 2010/0046281 A1* | 2/2010 | Uno | .......................... | G11C 8/08 365/156 |
| 2021/0265335 A1* | 8/2021 | Liaw | .................... | H01L 27/0207 |
| 2022/0037336 A1* | 2/2022 | Yang | ...................... | G11C 5/025 |

FOREIGN PATENT DOCUMENTS

JP        2010165791 A   * 7/2010

* cited by examiner

*Primary Examiner* — Ly D Pham
(74) *Attorney, Agent, or Firm* — Alston & Bird LLP

(57) ABSTRACT

The present application provides a dual-port SRAM cell and a layout structure thereof, comprises a first and a second NMOS transistors, a first and a second PMOS transistors; the gates of the first and second NMOS transistors and the drains of the first and second PMOS transistors are connected to a word line; the source of the first NMOS transistor is connected to a first bit line; the source of the first PMOS transistor is connected to a second bit line; the source of the second NMOS transistor is connected to a third bit line; the source of the second PMOS transistor is connected to a fourth bit line; the drain of the first NMOS transistor and the gate of the first PMOS transistor are connected to a common input node of a latch.

5 Claims, 1 Drawing Sheet

(51) Int. Cl.
*H01L 27/108* (2006.01)
*H01L 27/02* (2006.01)

DUAL-PORT SRAM CELL AND LAYOUT STRUCTURE THEREOF

CROSS-REFERENCES TO RELATED APPLICATIONS

This application claims priority to Chinese patent application No. CN 202010992678.8, filed on Sep. 21, 2020 at CNIPA, and entitled "DUAL-PORT SRAM CELL AND LAYOUT STRUCTURE THEREOF", the disclosure of which is incorporated herein by reference in entirety.

TECHNICAL FIELD

The present application relates to the field of integrated circuit design, in particular to a dual-port static random access memory (SRAM) cell and a layout structure thereof.

BACKGROUND

As the computer operating speed increases, the frequency requirements for a CPU become increasingly higher. A dual-port SRAM serves as a primary high-speed buffer of the CPU, it's read-write speed thereof is a very important parameter, which directly affects the actual operating speed of the CPU.

A layout design for a dual-port SRAM commonly used in the industry is shown in FIG. 1. The dual-port SRAM includes two PMOS transistors (PU1 and PU2), two NMOS transistors (PD1 and PD2), and four NMOS transistors (PG1-A, PG1-B, PG2-A, PG2-B). The dual-port SRAM connects to two word lines WL1 and WL2 and two sets of bit lines BL1, BL2 and BLB1, BLB2, and is capable of achieving a read-while-write function. There is an R-gate series resistor between PG1-B and the output of one inverter Q and between PG2-A and the output of another inverter Qb respectively. Due to the existence of the series resistance, the dual-port SRAM is asymmetric in its physical structure and has an inherent issue, that is, the speed of reading "0" and the speed of reading "1" are different.

For example, when node Q="0" and node Qb="1", a read current Iread at the BL1 end reaches Vss via PG1-A and PD1, and a read current Iread at the BLB2 end reaches Vss via PG1-B, R-gate, the gate of PD2, the gate of PU2, and PD1. Due to the voltage division effect of the series resistor R-gate, the read current Iread at the BLB2 end is smaller than the read current Iread at the BL1 end, so that the read speeds and results at both ends are different.

In addition, since during a read operation of the dual-port SRAM, each memory node is connected to two NMOS transistors PD1 and PD2 connected in parallel, a functional failure is more likely to occur if a read disturbance window of one of the NMOS transistors is smaller than the other. For the dual-port SRAM, because the two NMOS transistors are connected in parallel, a read disturbance window of a 8T SRAM (SRAM with 8 transfer transistors) is much smaller than that of a 6T SRAM (SRAM with 6 transfer transistors).

BRIEF SUMMARY

According to one embodiment of the current disclosure, a dual-port SRAM cell comprising: first and second NMOS transistors and first and second PMOS transistors, wherein the gates of the first and second NMOS transistors and the drains of the first and second PMOS transistors are connected to a common word line, the source of the first NMOS transistor is connected to a first bit line, the source of the first PMOS transistor is connected to a second bit line, the source of the second NMOS transistor is connected to a third bit line, and the source of the second PMOS transistor is connected to a fourth bit line; and a latch provided with an input node Q and an output node Qb, wherein the drain of the first NMOS transistor and the gate of the first PMOS transistor are connected to the common input node Q of the latch, and the drain of the second NMOS transistor and the gate of the second PMOS transistor are connected to the common output node Qb of the latch.

In some examples, the latch comprises first and second pull-up transistors and first and second pull-down transistors; wherein the drain of the first pull-up transistor, the drain of the first pull-down transistor, the gate of the second pull-up transistor, and the gate of the second pull-down transistor are connected to each other; the gate of the first pull-up transistor, the gate of the first pull-down transistor, the drain of the second pull-up transistor, and the drain of the second pull-down transistor are connected to each other, and a node serves as the output node Qb of the latch; the sources of the first and second pull-up transistors are connected to a common power supply voltage Vdd; and the source of the first pull-down transistor and the source of the second pull-down transistor are grounded.

In some examples, the first and second pull-up transistors are PMOS transistors; and the first and second pull-down transistors are NMOS transistors.

In some examples, in a read operation of the dual-port SRAM cell, the word line, the first bit line, and the third bit line are connected to the common power supply voltage Vdd; and the second bit line and the fourth bit line are grounded.

In some examples, in a write operation of the dual-port SRAM cell, the word line, the first bit line, the fourth bit line, and the second bit line are connected to the power supply voltage Vdd; and the third bit line is grounded.

In some examples, in a write operation of the dual-port SRAM cell, the word line, the third bit line, the fourth bit line, and the second bit line are connected to the power supply voltage Vdd; and the first bit line is grounded.

In some examples, in a sleep mode of the dual-port SRAM cell, and the word line, the fourth bit line, and the second bit line are grounded; and the first bit line and the third bit line are connected to the power supply voltage Vdd.

The present application further provides a layout structure of a dual-port SRAM cell, comprising at least:

an active region pattern layer containing first to sixth active region patterns, wherein the first to sixth active region patterns are sequentially arranged at intervals from left to right, a first NMOS transistor and a first pull-down transistor share the first active region pattern, the second active region pattern is used for a first pull-up transistor, the third active region pattern is used for a first PMOS transistor, the fourth active region pattern is used for a second PMOS transistor, the fifth active region pattern is used for a second pull-up transistor, and a second pull-down transistor and a second NMOS transistor share the sixth active region pattern;

a polysilicon pattern layer disposed on the active region pattern layer, the polysilicon pattern layer containing: a first polysilicon pattern crossing the first active region pattern and serving as the gate of the first NMOS transistor, and a second polysilicon pattern crossing the first, second, and fourth active region patterns, wherein a portion of the second polysilicon pattern that crosses the first active region pattern serves as the gate of the first pull-down transistor, a portion of the second polysilicon pattern that crosses the second active region pattern serves as the gate of the first pull-up transistor, and a portion of the second polysilicon pattern that crosses the fourth active region pattern serves as the gate of the second PMOS transistor;

the polysilicon pattern layer further containing: a third polysilicon pattern crossing the third, fifth, and sixth active region patterns, and a fourth polysilicon pattern crossing the sixth active region pattern, wherein a portion of the third polysilicon pattern that crosses the third active region pattern serves as the gate of the first PMOS transistor, a portion of the third polysilicon pattern that crosses the fifth active region pattern serves as the gate of the second pull-up transistor, a portion of the third polysilicon pattern that crosses the sixth active region pattern serves as the gate of the second pull-down transistor, and the fourth polysilicon pattern that crosses the sixth active region pattern serves as the gate of the second NMOS transistor;

a contact hole pattern layer disposed on the polysilicon pattern layer, the contact hole pattern layer containing: first and second contact hole patterns distributed on the first active region pattern and on upper and lower sides of the first polysilicon pattern, third and fourth contact hole patterns distributed on the first active region pattern and on a lower side of the second polysilicon pattern, fifth and sixth contact hole patterns distributed on the second active region pattern and on upper and lower sides of the second polysilicon pattern, seventh and eighth contact hole patterns distributed on the third active region pattern and on upper and lower sides of the third polysilicon pattern, ninth and tenth contact hole patterns distributed on the fourth active region pattern and on upper and lower sides of the second polysilicon pattern; eleventh and twelfth contact hole patterns distributed in the fifth active region pattern and on upper and lower sides of the third polysilicon pattern, thirteenth and fourteenth contact hole patterns distributed on the sixth active region pattern and on an upper side of the third polysilicon pattern, and fifteenth and sixteenth contact hole patterns distributed on the sixth active region pattern and on upper and lower sides of the fourth polysilicon pattern;

the contact hole pattern layer further containing: a seventeenth contact hole pattern at one end of the first polysilicon pattern, and an eighteenth contact hole pattern at one end of the fourth polysilicon pattern; and a first metal layer disposed on the contact hole pattern layer, the first metal layer containing: a first metal pattern disposed on the seventeenth contact hole pattern, a second metal pattern disposed on the first contact hole pattern, a third metal pattern disposed on the second contact hole pattern and connected to the fifth contact hole pattern, a fourth metal pattern disposed on the third and fourth contact hole patterns, a fifth metal pattern disposed on the sixth contact hole pattern, a sixth metal pattern disposed on the seventh contact hole pattern, a seventh metal pattern disposed on the eighth and ninth contact hole patterns, an eighth metal pattern disposed on the tenth contact hole pattern, a ninth metal pattern disposed on the eleventh contact hole pattern, a tenth metal pattern disposed on the twelfth and fifteenth contact hole patterns, an eleventh metal pattern disposed on the thirteenth and fourteenth contact hole patterns, a twelfth metal pattern disposed on the sixteenth contact hole pattern, and a thirteenth metal pattern disposed on the eighteenth contact hole pattern;

wherein the first, seventh, and thirteenth metal patterns are connected to a word line, the second metal pattern is connected to q first bit line, the fourth metal pattern and the eleventh metal pattern are grounded, the sixth metal pattern is connected to a second bit line, the eighth metal pattern is connected to a fourth bit line, the fifth metal pattern and the ninth metal pattern are connected to a power supply voltage Vdd, and the twelfth metal pattern is connected to a third bit line.

In some examples, the second polysilicon pattern and the third active region pattern partially overlap.

In some examples, the third polysilicon pattern and the fourth active region pattern partially overlap.

In some examples, the third polysilicon pattern has an end close to the second active region pattern and extending onto the second active region pattern, and partially overlaps the fifth contact hole pattern.

In some examples, the second polysilicon pattern has an end close to the fifth active region pattern and extending onto the fifth active region pattern, and partially overlaps the twelfth contact hole pattern.

As stated above, the dual-port SRAM cell and layout structure thereof in the present application have the following beneficial effects: according to the present application, the symmetry of the dual-port SRAM cell is significantly improved by means of the rearrangement of eight transistors, while the length and width of the conventional SRAM cell are not changed, thereby effectively improving the read-write speed and enlarging the read disturbance window; and the present application is compatible with the conventional process. Since the dual-port SRAM cell is widely applied to a first-stage high-speed buffer of a CPU and thus requires a relatively high speed, the present application has the practical significance.

DETAILED DESCRIPTION OF THE DISCLOSURE

The implementations of the present application are described below using specific examples. Those skilled in the art could easily understand other advantages and effects of the present application from the content disclosed in the specification. The present application can also be implemented or applied in other different specific implementations, and various details in the specification can also be modified or changed based on different viewpoints and applications without departing from the spirit of the present disclosure.

It should be noted that the figures provided in the embodiments only illustrate the basic concept of the present application in a schematic manner, so the figures only show the components related to the present application, but are not drawn according to the number, shape and size of the components in actual implementations. The pattern, number, and ratio of each component in actual implementations can be changed randomly, and the component layout pattern may be more complicated.

Figure 2:
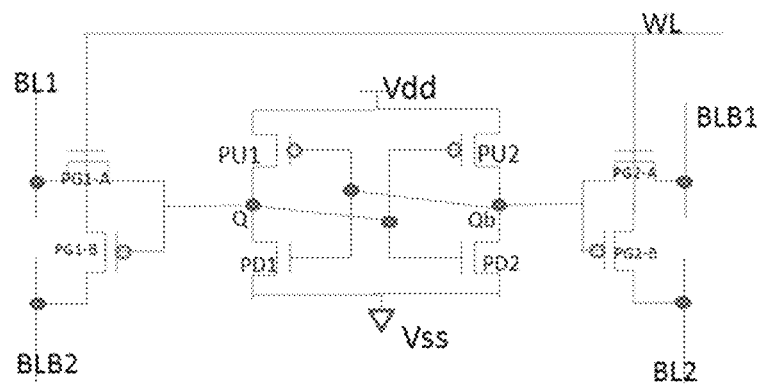
FIG. 2 illustrates a schematic diagram of a circuit structure of a dual-port SRAM cell, according to one embodiment of the present disclosure.

The present disclosure. provides a dual-port SRAM cell, referring to FIG. 2, which is a schematic diagram of a circuit structure of the dual-port SRAM cell according to one embodiment of the present disclosure. The dual-port SRAM cell in the present disclosure. includes at least the following:

A first and a second NMOS transistors and a first and a second PMOS transistors, wherein the gates of the first and second NMOS transistors and the drains of the first and second PMOS transistors are connected to a common word line respectively, the source of the first NMOS transistor is connected to a first bit line, the source of the first PMOS transistor is connected to a second bit line, the source of the second NMOS transistor is connected to a third bit line, and the source of the second PMOS transistor is connected to a fourth bit line.

In addition, a latch is provided with an input node Q and an output node Qb, wherein the drain of the first NMOS transistor and the gate of the first PMOS transistor are connected to the common input node Q of the latch, and the drain of the second NMOS transistor and the gate of the second PMOS transistor are connected to the common output node Qb of the latch.

Referring to FIG. 2, the dual-port SRAM cell in this embodiment includes the following: a first NMOS transistor (PG1-A), a second NMOS transistor (PG2-A), a first PMOS transistor (PG1-B), and a second PMOS transistor (PG2-B), wherein the gates of the first NMOS transistor (PG1-A) and the second NMOS transistor (PG2-A) and the drains of the first PMOS transistor (PG1-B) and the second PMOS transistor (PG2-B) are connected to a common word line WL respectively, the source of the first NMOS transistor (PG1-A) is connected to a first bit line BL1, the source of the first PMOS transistor (PG1-B) is connected to a second bit line BLB2, the source of the second NMOS transistor (PG2-A) is connected to a third bit line BLB1, and the source of the second PMOS transistor (PG2-B) is connected to a fourth bit line BL2.

Further, a latch provided with an input node Q and an output node Qb, wherein the drain of the first NMOS transistor (PG1-A) and the gate of the first PMOS transistor (PG1-B) are connected to the common input node Q of the latch, and the drain of the second NMOS transistor (PG2-A) and the gate of the second PMOS transistor (PG2-B) are connected to the common output node Qb of the latch.

Referring to FIG. 2, according to this embodiment of the present disclosure, the latch includes a first pull-up transistor (PU1), a second pull-up transistor (PU2), a first pull-down transistor (PD1), and a second pull-down transistor (PD2). The drain of the first pull-up transistor (PU1), the drain of the first pull-down transistor (PD1), the gate of the second pull-up transistor (PU2), and the gate of the second pull-down transistor (PD2) are connected to each other, and a node between the first pull-up PU1 and the first pull-down PD1 serves as the input node Q of the latch. The gate of the first pull-up transistor (PU1), the gate of the first pull-down transistor (PD1), the drain of the second pull-up transistor (PU2), and the drain of the second pull-down transistor (PD2) are connected to each other, and a node between the second pull-up PU1 and the second pull-down PD1 serves as the output node Qb of the latch. The source of the first pull-up transistor (PU1) and the source of the second pull-up transistor (PU2) are connected to a common power supply voltage Vdd; and the drain of the first pull-down transistor (PD1) and the drain of the second pull-down transistor (PD2) are connected to the ground Vss.

According to this embodiment of the present application, the first pull-up transistor (PU1) and the second pull-up transistor (PU2) are both PMOS transistors; and the first pull-down transistor (PD1) and the second pull-down transistor (PD2) are NMOS transistors.

According to this embodiment of the present application, in a read operation of the dual-port SRAM cell, the word line WL, the first bit line BL1, and the third bit line BLB1 are connected to the common power supply voltage Vdd; and the second bit line BLB2 and the fourth bit line BL2 are connected to the ground Vss.

According to this embodiment, the word line WL, the first bit line BL1, the fourth bit line BL2, and the second bit line BLB2 are connected to the power supply voltage Vdd; and the third bit line BLB1 is connected to the ground Vss.

According to another embodiment of the present application, in a write operation of the dual-port SRAM cell, the word line WL, the third bit line BLB1, the fourth bit line BL2, and the second bit line BLB2 are connected to the power supply voltage Vdd; and the first bit line BL1 is connected to the ground Vss.

According to this embodiment of the present application, in a sleep mode (low power mode) of the dual-port SRAM cell, and the word line WL, the fourth bit line BL2, and the second bit line BLB2 are connected to the ground Vss; and the first bit line BL1 and the third bit line BLB1 are connected to the power supply voltage Vdd.

The present disclosure further provides a layout structure of the dual-port SRAM cell, including at least: an active region pattern layer containing first to sixth active region patterns, wherein the first to sixth active region patterns are sequentially arranged from left to right with intervals, the first NMOS transistor and the first pull-down transistor share the first active region pattern, the second active region pattern is occupied by the first pull-up transistor, the third active region pattern is designated for the first PMOS transistor, the fourth active region pattern is taken for the second PMOS transistor, the fifth active region pattern is used for the second pull-up transistor, and the second pull-down transistor and the second NMOS transistor share the sixth active region pattern.

The layout structure of the dual-port SRAM cell further includes a polysilicon pattern layer over the active region pattern layers. The polysilicon pattern layer contains: a first polysilicon layer patterned in the first active region pattern and serving as the gate of the first NMOS transistor, and a second polysilicon layer patterned in the first, second, and fourth active region patterns, wherein a portion of the second polysilicon pattern that disposed in the first active region pattern serves as the gate of the first pull-down transistor, a portion of the second polysilicon layer patterned in the second active region pattern serves as the gate of the first pull-up transistor, and a portion of the second polysilicon layer patterned in the fourth active region pattern serves as the gate of the second PMOS transistor. The polysilicon pattern layer further contains: a third polysilicon pattern crossing the third, fifth, and sixth active region patterns, and a fourth polysilicon pattern crossing the sixth active region pattern, wherein a portion of the third polysilicon layer patterned in the third active region pattern serves as the gate of the first PMOS transistor, a portion of the third polysilicon layer patterned in the fifth active region pattern serves as the gate of the second pull-up transistor, a portion of the third polysilicon layer patterned in the sixth active region pattern serves as the gate of the second pull-down transistor, and the fourth polysilicon layer patterned in the sixth active region pattern serves as the gate of the second NMOS transistor.

The layout structure of the dual-port SRAM cell also includes contact holes layer patterned in the polysilicon layers. The contact hole patterns include: first and second contact hole distributed in the first active region pattern and on upper and lower sides of the first polysilicon pattern, third and fourth contact holes distributed in the first active region pattern and on a lower side of the second polysilicon pattern, fifth and sixth contact holes distributed in the second active region pattern and on upper and lower sides of the second polysilicon pattern, seventh and eighth contact holes distributed on the third active region pattern and on upper and lower sides of the third polysilicon pattern, ninth and tenth contact hole patterns distributed in the fourth active region pattern and on upper and lower sides of the second polysilicon pattern, eleventh and twelfth contact hole patterns distributed in the fifth active region pattern and on upper and lower sides of the third polysilicon pattern, thirteenth and fourteenth contact hole patterns distributed in the sixth active region pattern and on an upper side of the third polysilicon pattern, and fifteenth and sixteenth contact hole patterns distributed in the sixth active region pattern and on upper and lower sides of the fourth polysilicon pattern.

The contact hole layer further contains: a seventeenth contact hole at one end of the first polysilicon pattern, and an eighteenth contact hole at one end of the fourth polysilicon pattern.

The layout structure of the dual-port SRAM cell further includes a first metal layer disposed on the contact hole layer. The first metal layer contains: a first metal pattern disposed on the seventeenth contact hole pattern, a second metal pattern disposed on the first contact hole pattern, a third metal pattern disposed on the second contact hole pattern and connected to the fifth contact hole pattern, a fourth metal pattern disposed on the third and fourth contact hole patterns, a fifth metal pattern disposed on the sixth contact hole pattern, a sixth metal pattern disposed on the seventh contact hole pattern, a seventh metal pattern disposed on the eighth and ninth contact hole patterns, an eighth metal pattern disposed on the tenth contact hole pattern, a ninth metal pattern disposed on the eleventh contact hole pattern, a tenth metal pattern disposed on the twelfth and fifteenth contact hole patterns, an eleventh metal pattern disposed on the thirteenth and fourteenth contact hole patterns, a twelfth metal pattern disposed on the sixteenth contact hole pattern, and a thirteenth metal pattern disposed on the eighteenth contact hole pattern.

The first, seventh, and thirteenth metal patterns are connected to the word line, the second metal pattern is connected to the first bit line, the fourth metal pattern and the eleventh metal pattern are grounded, the sixth metal pattern is connected to the second bit line, the eighth metal pattern is connected to the fourth bit line, the fifth metal pattern and the ninth metal pattern are connected to the power supply voltage Vdd, and the twelfth metal pattern is connected to the third bit line.

Figure 3:
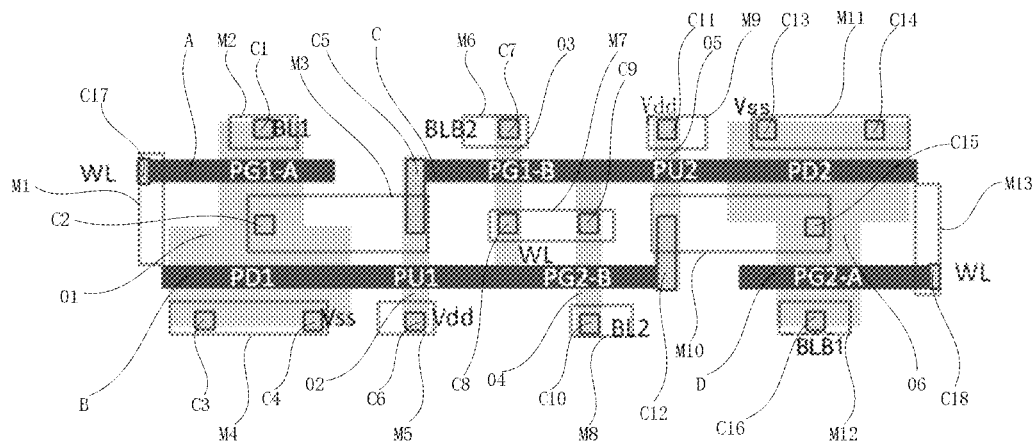
FIG. 3 illustrates a schematic diagram of a layout structure of the dual-port SRAM cell according to one embodiment of the present disclosure.

Referring to FIG. 3, which shows a schematic diagram of the layout structure of the dual-port SRAM cell in the present application, according to the embodiment of the present disclosure. A layout structure of the dual-port SRAM cell includes: an active region pattern layer containing the first to the sixth active region patterns which show as shaded areas, wherein the first to sixth active region patterns are sequentially arranged at intervals from left to right, that is, the first active region pattern is 01, the second active region pattern is 02, the third active region pattern is 03, the fourth active region pattern is 04, the fifth active region pattern 05, and the sixth active region pattern 06 are sequentially arranged at various intervals from left to right.

The first NMOS transistor (PG1-A) and the first pull-down transistor (PD1) share the first active region pattern 01, the second active region pattern 02 is used for forming the first pull-up transistor (PU1), the third active region pattern 03 is used for forming the first PMOS transistor (PG1-B), the fourth active region pattern 04 is used for forming the second PMOS transistor (PG2-B), the fifth active region pattern 05 is used for forming the second pull-up transistor (PU2), and the second pull-down transistor (PD2) and the second NMOS transistor (PG2-A) share the sixth active region pattern 06.

According to this embodiment, the layout structure of the dual-port SRAM cell further includes a polysilicon pattern layer disposed on the active region pattern layer. The polysilicon pattern layer is patterned into multiple parts. A first polysilicon pattern A, which is an elongated strip disposed partially on the first active region pattern 01 and serves as the gate of the first NMOS transistor (PG1-A). A second polysilicon pattern B which is also an elongated strip disposed across the first active region pattern 01, the second active region pattern 02, and the fourth active region pattern 04, wherein the portion of the second polysilicon pattern B that is disposed across the first active region pattern 01 serves as the gate of the first pull-down transistor (PD1), the portion of the second polysilicon pattern B that is disposed across the second active region pattern 02 serves as the gate of the first pull-up transistor (PU1), and the portion of the second polysilicon pattern B that is disposed across the fourth active region pattern 04 serves as the gate of the second PMOS transistor (PG2-B). The polysilicon pattern layer further contains: a third polysilicon pattern C that is disposed across the third active region pattern 03, the fifth active region pattern 05, and the sixth active region pattern 06. A fourth polysilicon pattern D that is disposed across the sixth active region pattern 06. The portion of the third polysilicon pattern C that is disposed across the third active region pattern 03 serves as the gate of the first PMOS transistor (PG1-B), the portion of the third polysilicon pattern C that is disposed across the fifth active region pattern 05 serves as the gate of the second pull-up transistor (PU2), the portion of the third polysilicon pattern C that is disposed across the sixth active region pattern 06 serves as the gate of the second pull-down transistor (PD2). The fourth polysilicon pattern D that is disposed across the sixth active region pattern 06 serves as the gate of the second NMOS transistor (PG2-A).

According to this embodiment, the layout structure of the dual-port SRAM cell further includes a contact hole layer on the polysilicon pattern layer. The contact hole layer includes a number of contact hole patterns: a first contact hole pattern C1 and a second contact hole pattern C2 both distributed in the first active region pattern 01 and on upper and lower sides of the first polysilicon pattern A, a third contact hole pattern C3 and a fourth contact hole pattern C4 distributed in the first active region pattern 01 and on the lower side of the second polysilicon pattern B, a fifth contact hole pattern C5 and a sixth contact hole pattern C6 distributed in the second active region pattern 02 and on upper and lower sides of the second polysilicon pattern B, a seventh contact hole pattern C7 and an eighth contact hole pattern C8 distributed in the third active region pattern 03 and on upper and lower sides of the third polysilicon pattern C, a ninth contact hole pattern C9 and a tenth contact hole pattern C10 distributed on the fourth active region pattern 04 and on upper and lower sides of the second polysilicon pattern B, an eleventh contact hole pattern C11 and a twelfth contact hole pattern C12 distributed in the fifth active region pattern 05 and on upper and lower sides of the third polysilicon pattern C, a thirteenth contact hole pattern C13 and a fourteenth contact hole pattern C14 distributed in the sixth active region pattern 04 and on an upper side of the third polysilicon pattern C, and a fifteenth contact hole pattern C15 and a sixteenth contact hole pattern C16 distributed in the sixth active region pattern 06 and on upper and lower sides of the fourth polysilicon pattern D.

According to this embodiment, the contact hole pattern layer further contains: a seventeenth contact hole pattern C17 at one end of the first polysilicon pattern A, and an eighteenth contact hole pattern C18 at one end of the fourth polysilicon pattern D.

According to this embodiment, the layout structure of the dual-port SRAM cell further includes a first metal layer disposed on the contact hole pattern layer. The first metal layer contains: a first metal pattern M1 disposed on the seventeenth contact hole pattern C17, a second metal pattern M2 disposed o the first contact hole pattern C1, a third metal pattern M3 disposed o the second contact hole pattern C2 and connected to the fifth contact hole pattern C5, a fourth metal pattern M4 disposed on the third contact hole pattern C3 and THE fourth contact hole pattern C4, a fifth metal pattern M5 disposed on the sixth contact hole pattern C6, a sixth metal pattern M6 disposed on the seventh contact hole pattern C7, a seventh metal pattern M7 disposed on the eighth contact hole pattern C8 and the ninth contact hole pattern C9, an eighth metal pattern M8 disposed on the tenth contact hole pattern C10, a ninth metal pattern M9 disposed on the eleventh contact hole pattern C11, a tenth metal pattern M10 disposed on the twelfth contact hole pattern C12 and THE fifteenth contact hole pattern C15, an eleventh metal pattern M11 disposed on the thirteenth contact hole pattern C13 and the fourteenth contact hole pattern C14, a twelfth metal pattern M12 disposed on the sixteenth contact hole pattern C16, and a thirteenth metal pattern M13 disposed on the eighteenth contact hole pattern C18.

In the layout structure according to this embodiment, the first metal pattern M1, the seventh metal pattern M7, and the thirteenth metal pattern M13 are connected to the word line WL, the second metal pattern M2 is connected to the first bit line BL1, the fourth metal pattern M4 and the eleventh metal pattern M11 are connected to the ground Vss, the sixth metal pattern M6 is connected to the second bit line BLB2, the eighth metal pattern M8 is connected to the fourth bit line BL2, the fifth metal pattern M5 and the ninth metal pattern M9 are connected to the power supply voltage Vdd, and the twelfth metal pattern M12 is connected to the third bit line BLB1.

According to this embodiment of the present application, the second polysilicon pattern B and the third active region pattern 03 partially overlap. Referring to FIG. 3, since the second polysilicon pattern B is disposed across the first, second, and fourth active region patterns, and the active region pattern 03 is located between the second and fourth active region patterns, the portion of the second polysilicon pattern B overlaps one end of the third active region pattern. According to this embodiment of the present application, the third polysilicon pattern and the fourth active region pattern partially overlap. Since the third polysilicon pattern C is disposed across the third active region pattern 03, the fifth active region pattern 05, and the sixth active region pattern 06, and the fourth active region pattern 04 is located between the third and fifth active region patterns, one end of the fourth active region pattern 04 overlaps partially the third polysilicon pattern C.

According to this embodiment of the present application, the third polysilicon pattern C has an end close to the second active region pattern 02 and extending onto the second active region pattern 02, and partially overlaps the fifth contact hole pattern C5.

According to this embodiment, the second polysilicon pattern B has an end close to the fifth active region pattern 05 and extending onto the fifth active region pattern 05, and partially overlaps the twelfth contact hole pattern C12.

Figure 1:
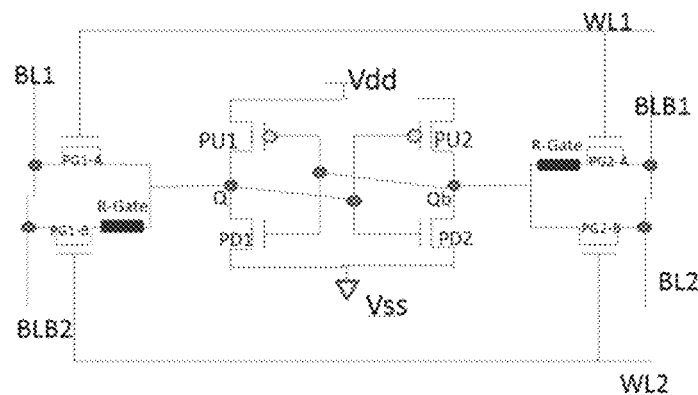
FIG. 1 illustrates a schematic diagram of a circuit structure of a dual-port SRAM cell.

Compared with the conventional structure shown in FIG. 1, the first bit line BL1 and the third bit line BLB1 in the present disclosure are placed symmetrical, and no resistive gate serves as a connection for transmitting node information as in FIG. 1, thereby avoiding a voltage drop. The second bit line BLB2 and the fourth bit line BL2 are also symmetrical, there are two PMOS transistors including the first PMOS transistor (PG1-B) and the second PMOS transistor (PG2-B) and only one word line WL, the word line WL serves as the drains of the first PMOS transistor (PG1-B) and of the second PMOS transistor (PG2-B), and the gates of the two PMOS transistors are controlled by the node Q, thereby enlarging the read disturbance window. The first PMOS transistor (PG1-B) and the second transistor PMOS (PG2-B) share the gate with the first and second pull-up transistors, thereby eliminating a voltage drop resulting from the use of the resistive gate as a connection for providing node storage information, so that the entire memory cell is symmetrical. In addition, a bit line mismatch problem is avoided. The active region sizes of the first and second PMOS transistors depend on the demand of a read current. Since a read current of a channel where the first and second NMOS transistors are located is limited by a linear current of the two pull-down transistors, and a read current of a channel where the first and second PMOS transistors are located are determined by a saturation current, the active region sizes of the first and second PMOS transistors are not greater than the active region sizes of the first and second NMOS transistors.

In conclusion, according to the present application, the symmetry of the dual-port SRAM cell is significantly improved by means of the rearrangement of eight transistors, while the length and width of the conventional SRAM cell are not changed, thereby effectively improving the read-write speed and enlarging the read disturbance window; and the present application is compatible with the conventional process. Since the dual-port SRAM cell is widely applied to a first-stage high-speed buffer of a CPU and thus requires a relatively high speed, the present application has the practical significance of reducing a voltage drop resulting from the use of the gate as a connection. Therefore, the present application effectively overcomes various shortcomings in the prior art and thus has high industrial utilization value.

It should be understood that the examples and embodiments described herein are for illustrative purposes only and that various modifications or changes in light thereof will be suggested to persons skilled in the art and are to be included within the spirit and purview of this application.

What is claimed is:

1. A layout structure of a dual-port SRAM cell, comprising:

an active region pattern layer comprising a first, a second, a third, a fourth, a fifth, and a sixth active region patterns, sequentially arranged at intervals from left to right;

wherein a first NMOS transistor and a first pull-down transistor share the first active region pattern, a first pull-up transistor is arranged in the second active region pattern, a first PMOS transistor is arranged in the third active region pattern, a second PMOS transistor is arranged in the fourth active region pattern, a second pull-up transistor is arranged in the fifth active region pattern, and wherein a second pull-down transistor and a second NMOS transistor share the sixth active region pattern;

a polysilicon pattern layer disposed on the active region pattern layer, wherein the polysilicon pattern layer comprises:

a first polysilicon pattern disposed across the first active region pattern and serving as a gate of the first NMOS transistor;

a second polysilicon pattern disposed across the first, second, and fourth active region patterns, wherein a portion of the second polysilicon pattern that is disposed across the first active region pattern serves as a gate of the first pull-down transistor, a portion of the second polysilicon pattern that is disposed across the second active region pattern serves as a gate of the first pull-up transistor, and a portion of the second polysilicon pattern that is disposed across the fourth active region pattern serves as a gate of the second PMOS transistor;

wherein the polysilicon pattern layer further comprises:

a third polysilicon pattern disposed across the third, the fifth, and the sixth active region patterns; and a fourth polysilicon pattern disposed across the sixth active region pattern, wherein a portion of the third polysilicon pattern that is disposed across the third active region pattern serves as a gate of the first PMOS transistor, a portion of the third polysilicon pattern that is disposed across the fifth active region pattern serves as a gate of the second pull-up transistor, a portion of the third polysilicon pattern that disposed across the sixth active region pattern serves as a gate of the second pull-down transistor, and the fourth polysilicon pattern that is disposed across the sixth active region pattern serves as a gate of the second NMOS transistor;

a contact hole pattern layer disposed across the polysilicon pattern layer, wherein the contact hole pattern layer comprises:

a first contact hole pattern and a second contact hole pattern distributed in the first active region pattern and on upper and lower sides of the first polysilicon pattern, a third contact hole pattern and a fourth contact hole pattern distributed in the first active region pattern and on a lower side of the second polysilicon pattern, a fifth contact hole pattern and a sixth contact hole pattern distributed in the second active region pattern and on upper and lower sides of the second polysilicon pattern, a seventh contact hole pattern and a eighth contact hole pattern distributed in the third active region pattern and on upper and lower sides of the third polysilicon pattern, a ninth contact hole pattern and a tenth contact hole pattern distributed in the fourth active region pattern and on upper and lower sides of the second polysilicon pattern, a eleventh contact hole pattern and a twelfth contact hole pattern distributed in the fifth active region pattern and on upper and lower sides of the third polysilicon pattern, a thirteenth contact hole pattern and a fourteenth contact hole pattern distributed in the sixth active region pattern and on an upper side of the third polysilicon pattern, and a fifteenth contact hole pattern and a sixteenth contact hole pattern distributed in the sixth active region pattern and on upper and lower sides of the fourth polysilicon pattern;

wherein the contact hole pattern layer further comprises:

a seventeenth contact hole pattern at one end of the first polysilicon pattern, and an eighteenth contact hole pattern at one end of the fourth polysilicon pattern;

wherein a first metal layer is disposed on the contact hole pattern layer, wherein the first metal layer comprises: a first metal pattern disposed on the seventeenth contact hole pattern, a second metal pattern disposed on the first contact hole pattern, a third metal pattern disposed on the second contact hole pattern and connected to the fifth contact hole pattern, a fourth metal pattern disposed on the third and fourth contact hole patterns, a fifth metal pattern disposed on the sixth contact hole pattern, a sixth metal pattern disposed on the seventh contact hole pattern, a seventh metal pattern disposed on the eighth and ninth contact hole patterns, an eighth metal pattern disposed on the tenth contact hole pattern, a ninth metal pattern disposed on the eleventh contact hole pattern, a tenth metal pattern disposed on the twelfth and fifteenth contact hole patterns, an eleventh metal pattern disposed on the thirteenth and fourteenth contact hole patterns, a twelfth metal pattern disposed on the sixteenth contact hole pattern, and a thirteenth metal pattern disposed on the eighteenth contact hole pattern; and wherein the first, seventh, and thirteenth metal patterns are connected to a word line, the second metal pattern is connected to a first bit line, the fourth metal pattern and the eleventh metal pattern are grounded, the sixth metal pattern is connected to a second bit line, the eighth metal pattern is connected to a fourth bit line, the fifth metal pattern and the ninth metal pattern are connected to a common power supply of voltage Vdd, and the twelfth metal pattern is connected to a third bit line.

2. The layout structure of a dual-port SRAM cell according to claim 1, wherein the second polysilicon pattern and the third active region pattern partially overlap.

3. The layout structure of a dual-port SRAM cell according to claim 1, wherein the third polysilicon pattern and the fourth active region pattern partially overlap.

4. The layout structure of a dual-port SRAM cell according to claim 1, wherein the third polysilicon pattern has one end which is in proximity of the second active region and extends onto the second active region pattern, and partially overlaps the fifth contact hole pattern.

5. The layout structure of a dual-port SRAM cell according to claim 1, wherein the second polysilicon pattern has one end, which is in proximity of the fifth active region and extends onto the fifth active region pattern, and partially overlaps the twelfth contact hole pattern.

* * * * *